United States Patent
Kaneda et al.

(10) Patent No.: US 11,804,465 B2
(45) Date of Patent: Oct. 31, 2023

(54) SEMICONDUCTOR DEVICE

(71) Applicant: Sumitomo Electric Industries, Ltd., Osaka (JP)

(72) Inventors: Tatsushi Kaneda, Osaka (JP); Hirotaka Oomori, Osaka (JP); Ren Kimura, Osaka (JP); Toru Hiyoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 205 days.

(21) Appl. No.: 17/427,950

(22) PCT Filed: Jan. 21, 2020

(86) PCT No.: PCT/JP2020/001952
§ 371 (c)(1),
(2) Date: Aug. 3, 2021

(87) PCT Pub. No.: WO2020/166283
PCT Pub. Date: Aug. 20, 2020

(65) Prior Publication Data
US 2022/0130792 A1    Apr. 28, 2022

(30) Foreign Application Priority Data
Feb. 13, 2019 (JP) .................... 2019-023136

(51) Int. Cl.
*H01L 23/00* (2006.01)
*H01L 25/07* (2006.01)
*H01L 25/18* (2023.01)

(52) U.S. Cl.
CPC ............ *H01L 24/48* (2013.01); *H01L 25/072* (2013.01); *H01L 25/18* (2013.01);
(Continued)

(58) Field of Classification Search
CPC ....... H01L 24/48; H01L 25/072; H01L 25/18; H01L 2224/48091; H01L 2224/48137; H01L 2224/48227
See application file for complete search history.

(56) References Cited

U.S. PATENT DOCUMENTS 10,032,745 B2 * 7/2018 Miyaki ................. H01L 23/544
2010/0013085 A1   1/2010 Oi et al.
(Continued)

FOREIGN PATENT DOCUMENTS

JP    2003-218318 A    7/2003
JP    2010-27814 A     2/2010
(Continued)

*Primary Examiner* — Marc Anthony Armand
(74) *Attorney, Agent, or Firm* — XSENSUS LLP

(57) ABSTRACT

A semiconductor includes: a substrate; a circuit pattern on the substrate, and including a first region, a second region located away from the first region, and a third region between the first region and the second region; a first chip disposed in the second region and including a diode; a second chip disposed in the third region, the second chip including a vertical transistor having a source pad disposed on a surface opposite to a surface facing the third region in a thickness direction of the substrate, and a gate pad disposed at a position different from the source pad; a first wire including a first bonded portion bonded to the first region, a second bonded portion bonded to the second chip, and a third bonded portion bonded to the first chip; and a second wire arranged to be adjacent to the first wire with the gate pad sandwiched therebetween.

10 Claims, 9 Drawing Sheets

(52) U.S. Cl.
CPC ............ *H01L 2224/48091* (2013.01); *H01L 2224/48137* (2013.01); *H01L 2224/48227* (2013.01); *H01L 2924/10272* (2013.01); *H01L 2924/12032* (2013.01); *H01L 2924/13091* (2013.01)

(56) References Cited

U.S. PATENT DOCUMENTS

| | | | |
|---|---|---|---|
| 2014/0231926 A1 | 8/2014 | Okumura | |
| 2015/0060940 A1* | 3/2015 | Muto | H01L 25/162 |
| | | | 257/140 |

FOREIGN PATENT DOCUMENTS

| | | |
|---|---|---|
| JP | 2014-195082 A | 10/2014 |
| JP | 2015-18946 A | 1/2015 |
| WO | 2013/046824 A1 | 4/2013 |

* cited by examiner

SEMICONDUCTOR DEVICE

CROSS-REFERENCE TO RELATED APPLICATIONS

The present application is based on PCT filing PCT/JP2020/001952, filed Jan. 21, 2020, which claims priority to JP 2019-023136, filed on Feb. 13, 2019, the entire contents of each are incorporated herein by reference.

TECHNICAL FIELD

The present disclosure relates to a semiconductor device.
The present application claims priority based on Japanese Patent Application No. 2019-023136 filed on Feb. 13, 2019, the entire contents of which are incorporated herein by reference.

BACKGROUND ART

A semiconductor device having semiconductor chips disposed on a circuit board is known (see, for example, Patent Literature 1 and Patent Literature 2). Wires are used to connect between a circuit pattern and a semiconductor chip, and between the semiconductor chips.

CITATION LIST

Patent Literature

Patent Literature 1: Japanese Patent Application Laid-Open No. 2014-195082
Patent Literature 2: Japanese Patent Application Laid-Open No. 2015-18946

SUMMARY OF INVENTION

A semiconductor device according to a first aspect of the present disclosure includes: a substrate; a circuit pattern disposed on the substrate, the circuit pattern including a first region, a second region located away from the first region, and a third region located between the first region and the second region; a first chip disposed in the second region, the first chip including a diode; a second chip disposed in the third region, the second chip including a vertical transistor having a source pad disposed on a surface opposite to a surface facing the third region in a thickness direction of the substrate, and a gate pad disposed at a position different from the source pad; a first wire including a first bonded portion bonded to the first region, a second bonded portion bonded to the second chip, and a third bonded portion bonded to the first chip; and a second wire arranged to be adjacent to the first wire with the gate pad sandwiched therebetween, the second wire including a fourth bonded portion bonded to the first region, a fifth bonded portion bonded to the second chip, and a sixth bonded portion bonded to the first chip. As viewed in the thickness direction of the substrate, a first imaginary straight line passing through the center of gravity of the first bonded portion and the center of gravity of the second bonded portion and a second imaginary straight line passing through the center of gravity of the fourth bonded portion and the center of gravity of the fifth bonded portion are parallel. A distance between the second imaginary straight line and the center of gravity of the third bonded portion is greater than a distance between the second imaginary straight line and the center of gravity of the second bonded portion. A relationship of $0<\theta \leq \sin^{-1} d/w$ is fulfilled, where d represents a distance between the first imaginary straight line and the second imaginary straight line, $\theta$ represents an angle of acute angle between the first imaginary straight line and a third imaginary straight line passing through the center of gravity of the second bonded portion and the center of gravity of the third bonded portion, and w represents a width of the second bonded portion in a direction in which the first wire extends.

A semiconductor device according to a second aspect of the present disclosure includes: a substrate; a circuit pattern disposed on the substrate, the circuit pattern including a first region, a second region located away from the first region, and a third region located between the first region and the second region; a third chip disposed in the second region, the third chip including a first diode; a fourth chip disposed in the second region at a position different from the third chip, the fourth chip including a second diode; a second chip disposed in the third region, the second chip including a vertical transistor having a source pad disposed on a surface opposite to a surface facing the third region in a thickness direction of the substrate, and a gate pad disposed at a position different from the source pad; a first wire including a first bonded portion bonded to the first region, a second bonded portion bonded to the second chip, and a third bonded portion bonded to the first chip; and a second wire arranged to be adjacent to the first wire with the gate pad sandwiched therebetween, the second wire including a fourth bonded portion bonded to the first region, a fifth bonded portion bonded to the second chip, and a sixth bonded portion bonded to the first chip. As viewed in the thickness direction of the substrate, a first imaginary straight line passing through the center of gravity of the first bonded portion and the center of gravity of the second bonded portion and a second imaginary straight line passing through the center of gravity of the fourth bonded portion and the center of gravity of the fifth bonded portion are parallel. A distance between the second imaginary straight line and the center of gravity of the third bonded portion is greater than a distance between the second imaginary straight line and the center of gravity of the second bonded portion. A relationship of $0<\theta<\sin^{-1} d/w$ is fulfilled, where d represents a distance between the first imaginary straight line and the second imaginary straight line, $\theta$ represents an angle of acute angle between the first imaginary straight line and a third imaginary straight line passing through the center of gravity of the second bonded portion and the center of gravity of the third bonded portion, and w represents a width of the second bonded portion in a direction in which the first wire extends.

DESCRIPTION OF EMBODIMENTS

Figure 1:
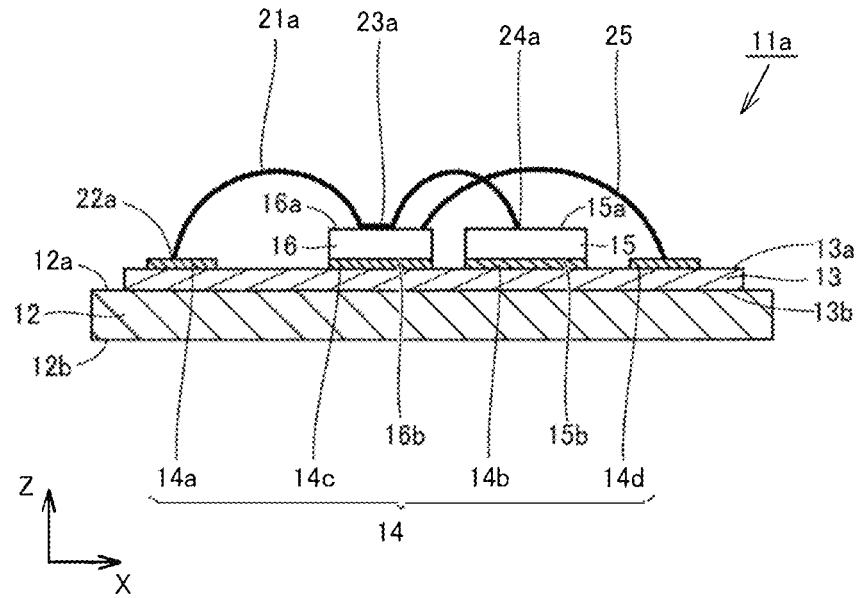
FIG. 1 is a schematic cross-sectional view of a semiconductor device in Embodiment 1.

Problem to be Solved by the Present Disclosure

In the process of producing a semiconductor device, semiconductor chips are placed on a substrate having a circuit pattern formed thereon, and wires are used to connect some areas of the circuit pattern to the semiconductor chips and the semiconductor chips to each other. If a tool (bond tool) used to bond a wire to the circuit pattern or to a semiconductor chip comes into contact with a previously installed wire, the wire may bend. This may lead to malfunction of the semiconductor device. It is thus required to suppress bending of wires during production.

In view of the foregoing, one of the objects is to provide a semiconductor device that can suppress bending of wires.

Effects of the Present Disclosure

According to the semiconductor devices described above, it is possible to suppress bending of wires.

DESCRIPTION OF EMBODIMENTS OF THE PRESENT DISCLOSURE

Firstly, embodiments of the present disclosure will be listed and described. The semiconductor device according to the first aspect of the present disclosure includes: a substrate; a circuit pattern disposed on the substrate, the circuit pattern including a first region, a second region located away from the first region, and a third region located between the first region and the second region; a first chip disposed in the second region, the first chip including a diode; a second chip disposed in the third region, the second chip including a vertical transistor having a source pad disposed on a surface opposite to a surface facing the third region in a thickness direction of the substrate, and a gate pad disposed at a position different from the source pad; a first wire including a first bonded portion bonded to the first region, a second bonded portion bonded to the second chip, and a third bonded portion bonded to the first chip; and a second wire arranged to be adjacent to the first wire with the gate pad sandwiched therebetween, the second wire including a fourth bonded portion bonded to the first region, a fifth bonded portion bonded to the second chip, and a sixth bonded portion bonded to the first chip. As viewed in the thickness direction of the substrate, a first imaginary straight line passing through the center of gravity of the first bonded portion and the center of gravity of the second bonded portion and a second imaginary straight line passing through the center of gravity of the fourth bonded portion and the center of gravity of the fifth bonded portion are parallel. A distance between the second imaginary straight line and the center of gravity of the third bonded portion is greater than a distance between the second imaginary straight line and the center of gravity of the second bonded portion. A relationship of $0<\theta<\sin^{-1} d/w$ is fulfilled, where d represents a distance between the first imaginary straight line and the second imaginary straight line, θ represents an angle of acute angle between the first imaginary straight line and a third imaginary straight line passing through the center of gravity of the second bonded portion and the center of gravity of the third bonded portion, and w represents a width of the second bonded portion in a direction in which the first wire extends.

In the second chip including the vertical transistor provided in the semiconductor device, in order to reduce the risk of increase of the basal plane dislocation due to the parasitic diode being turned on, it is preferable to place the first chip including the diode in parallel with the second chip. At this time, performing stitch bonding in the order of the first chip, the second chip, and the circuit pattern can reduce the occurrence of ringing caused by the surge voltage generated between the drain and source in the second chip at turn-off, for example.

In order to more reliably suppress the turning on of the parasitic diode, it is desirable to reduce the resistance of the first chip during forward bias. In order to reduce the resistance during forward bias of the first chip, the area of the first chip may be made larger than the area of the second chip as viewed in the thickness direction of the substrate. When a wire is bonded continuously from the first chip with a large area to the second chip with a small area, the wire may be bent at the bonded portion to the second chip.

Stitch bonding can be performed using a wire bonder equipped with a bond tool, for example. In the above semiconductor device, the relationship of $0<\theta<\sin^{-1} d/w$ is fulfilled. In other words, θ is set such that the relationship of $0<\theta<\sin^{-1} d/w$ holds. With this configuration, when the first wire is to be bent and bonded to the second chip at the second bonded portion, the risk of contact between the bond tool and the already installed second wire can be reduced. Therefore, according to the above semiconductor device, it is possible to suppress bending of the wire. As used herein, parallel means two straight lines extending in parallel; it does not mean parallel in the strict sense of geometry.

The above semiconductor device may further include a third wire including a seventh bonded portion bonded to the first region, an eighth bonded portion bonded to the second chip, and a ninth bonded portion bonded to the first chip. In this case, a relationship of $|D_1-D_2|>|L_1-L_2|$ may be fulfilled, where $D_1$ represents a distance between the second bonded portion and the third bonded portion, $D_2$ represents a distance between the eighth bonded portion and the ninth bonded portion, $L_1$ represents a length of the first wire from the second bonded portion to the third bonded portion, and $L_2$ represents a length of the third wire from the eighth bonded portion to the ninth bonded portion.

With this configuration, the difference in length between the first wire and the third wire in the portions connecting the second chip and the first chip can be made smaller, whereby the difference in resistance of the wires can be reduced. It is thus possible to avoid the concentration of electric current in the first chip, and substantially suppress the increase in resistance of the first chip. It is also possible to avoid the concentration of electric current in a specific wire, and suppress the reduction of wire life due to heat generation in the wire.

In the above semiconductor device, as viewed in the thickness direction of the substrate, the circuit pattern may further include a fourth region located on an opposite side of the first region as seen from the first chip. In this case, the semiconductor device may further include a gate wire connecting the gate pad and the fourth region. This facilitates the arrangement of the gate wire.

In the above semiconductor device, as viewed in the thickness direction of the substrate, the first chip may have an area greater than an area of the second chip. This can reduce the resistance in the first chip.

In the above semiconductor device, the second chip may include a SiC semiconductor layer. Adopting such a second chip capable of achieving high breakdown voltage and low on-resistance leads to a high-performance semiconductor device.

In the above semiconductor device, the first chip may include a SiC semiconductor layer. Adopting such a first chip capable of achieving high breakdown voltage and low on-resistance leads to a high-performance semiconductor device.

The semiconductor device according to the second aspect of the present disclosure includes: a substrate; a circuit pattern disposed on the substrate, the circuit pattern including a first region, a second region located away from the first region, and a third region located between the first region and the second region; a third chip disposed in the second region, the third chip including a first diode; a fourth chip disposed in the second region at a position different from the third chip, the fourth chip including a second diode; a second chip disposed in the third region, the second chip including a vertical transistor having a source pad disposed on a surface opposite to a surface facing the third region in a thickness direction of the substrate, and a gate pad disposed at a position different from the source pad; a first wire including a first bonded portion bonded to the first region, a second bonded portion bonded to the second chip, and a third bonded portion bonded to the first chip; and a second wire arranged to be adjacent to the first wire with the gate pad sandwiched therebetween, the second wire including a fourth bonded portion bonded to the first region, a fifth bonded portion bonded to the second chip, and a sixth bonded portion bonded to the first chip. As viewed in the thickness direction of the substrate, a first imaginary straight line passing through the center of gravity of the first bonded portion and the center of gravity of the second bonded portion and a second imaginary straight line passing through the center of gravity of the fourth bonded portion and the center of gravity of the fifth bonded portion are parallel. A distance between the second imaginary straight line and the center of gravity of the third bonded portion is greater than a distance between the second imaginary straight line and the center of gravity of the second bonded portion. A relationship of $0<\theta<\sin^{-1} d/w$ is fulfilled, where d represents a distance between the first imaginary straight line and the second imaginary straight line, θ represents an angle of acute angle between the first imaginary straight line and a third imaginary straight line passing through the center of gravity of the second bonded portion and the center of gravity of the third bonded portion, and w represents a width of the second bonded portion in a direction in which the first wire extends.

According to such a semiconductor device, bending of wires can be suppressed similarly as in the semiconductor device according to the first aspect above.

In the above semiconductor device, as viewed in the thickness direction of the substrate, a total area of the first chip and the third chip may be greater than an area of the second chip. This can reduce the electric current flowing toward the second chip.

DETAILS OF THE EMBODIMENTS OF THE PRESENT DISCLOSURE

Embodiments of the semiconductor device of the present disclosure will now be described with reference to the drawings. In the following drawings, the same or corresponding parts are denoted by the same reference numerals and the description thereof will not be repeated.

Embodiment 1

Figure 2:
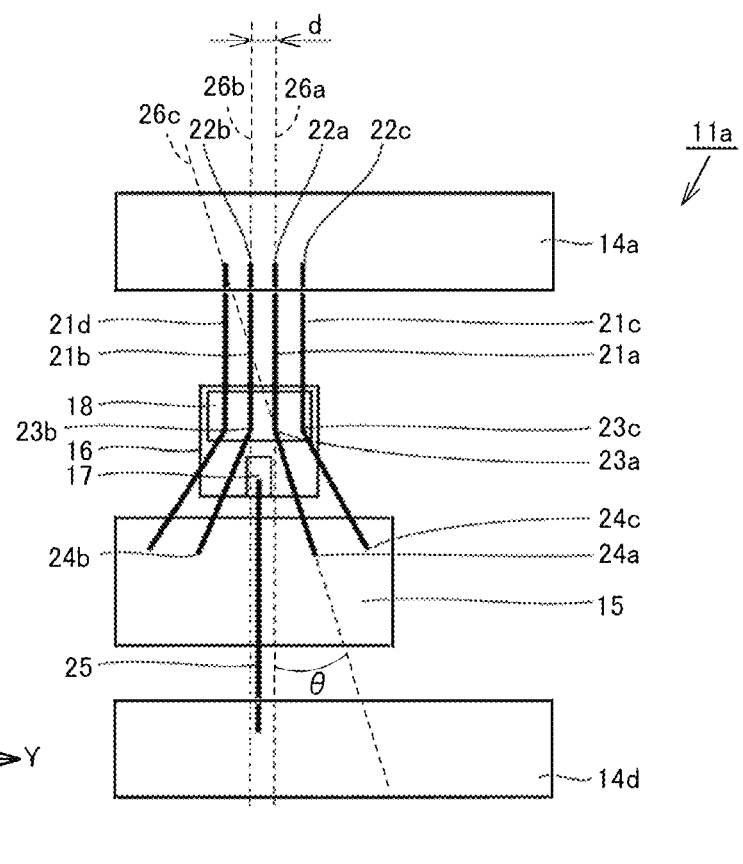
FIG. 2 is a schematic plan view of the semiconductor device shown in FIG. 1 as viewed in the thickness direction of the substrate.

A description will be made about the configuration of a semiconductor device in Embodiment 1 of the present disclosure. FIG. 1 is a schematic cross-sectional view of the semiconductor device in Embodiment 1. FIG. 2 is a schematic plan view of the semiconductor device shown in FIG. 1 as viewed in a thickness direction of a substrate.

Referring to FIGS. 1 and 2, the semiconductor device 11*a* in Embodiment 1 includes a heat dissipation plate 12, a substrate 13 disposed on the heat dissipation plate 12, a circuit pattern 14, a first chip 15 including a diode, and a second chip 16 including a vertical transistor.

The heat dissipation plate 12 is made of metal. For example, the heat dissipation plate 12 is made of copper. The heat dissipation plate 12 has its surface nickel-plated, for example. The heat dissipation plate 12 has a planar shape of a rectangle, for example. The heat dissipation plate 12 has one main surface 12*a* on which the substrate 13 is placed. The heat dissipation plate 12 has another main surface 12*b* on which, for example, a heat dissipation fin (not shown) for efficient heat dissipation may be attached.

The substrate 13 has insulating properties. The substrate 13 is made of ceramic, for example. The substrate 13 is composed of at least one of AlN, SiN, and $Al_2O_3$, for example. The substrate 13 may be made of glass. The substrate 13 has a planar shape of a rectangle, for example. With the substrate 13 having one main surface and another main surface, the substrate 13 is arranged such that the other main surface 13*b* of the substrate 13 contacts the one main surface 12*a* of the heat dissipation plate 12.

The circuit pattern 14 is disposed on the substrate 13. Specifically, the circuit pattern 14 is disposed on the one main surface 13*a* of the substrate 13. The circuit pattern 14 is made of copper, for example. Specifically, the circuit pattern 14 is copper wiring. The circuit pattern 14 includes a first region 14*a*, a second region 14*b*, a third region 14*c*, and a fourth region 14*d*. The second region 14*b* is located away from the first region 14*a*. The third region 14*c* is located between the first region 14*a* and the second region 14*b*. In the second region 14*b*, the first chip 15 is placed. In the third region 14*c*, the second chip 16 is placed. The fourth region 14*d* is located on the opposite side of the first region 14*a* as seen from the first chip 15.

The first chip 15 is a chip including, for example, a Schottky barrier diode. The first chip 15 has a planar shape of a rectangle, for example. That is, as viewed in the thickness direction of the substrate 13, the first chip 15 has a rectangular shape. In the first chip 15, a cathode electrode is disposed on the side of a surface 15*b* that contacts the second region 14*b*, and an anode electrode is disposed on the side of a surface 15*a* that is opposite to the surface 15*b* in the thickness direction of the substrate 13. The first chip 15 includes a SiC semiconductor layer. The SiC semiconductor layer is disposed between the anode electrode and the cathode electrode.

The second chip 16 is, for example, a vertical MOSFET (Metal-Oxide-Semiconductor Field Effect Transistor). The second chip 16 has a planar shape of a rectangle, for example. That is, as viewed in the thickness direction of the substrate 13, the second chip 16 has a rectangular shape. The second chip 16 has a source pad 18 and a gate pad 17 disposed on a surface 16a opposite to the surface 16b facing the third region 14c in the thickness direction of the substrate 13, the gate pad 17 being located at a position different from the source pad 18. In the second chip 16, a drain electrode is disposed on the side of the surface 16b contacting the third region 14c, and a source electrode, electrically connected to the source pad 18, and the gate pad 17 are disposed on the side of the surface 16a opposite to the surface 16b in the thickness direction of the substrate 13. The gate pad 17 is electrically connected to a gate electrode of the second chip 16. The second chip 16 includes a SiC semiconductor layer. The SiC semiconductor layer is disposed between the drain electrode and the source electrode.

As viewed in the thickness direction of the substrate 13, the first chip 15 has an area that is greater than the area of the second chip 16. In the present embodiment, the first chip 15 has a length in the X direction that is longer than the length in the X direction of the second chip 16. The first chip 15 has a length in the Y direction that is longer than the length in the Y direction of the second chip 16. Ensuring a large area of the first chip 15 facilitates connecting a large number of wires, which will be described later, and thus facilitates lowering the resistance of the first chip 15.

The second chip 16 is disposed between the first region 14a and the first chip 15 as viewed in the thickness direction of the substrate 13. In the semiconductor device 11a, as viewed in the thickness direction of the substrate 13, the first region 14a of the circuit pattern 14, the second chip 16, the first chip 15, and the fourth region 14d of the circuit pattern 14 are arranged in this order along the X direction.

The semiconductor device 11a includes a first wire 21a, a second wire 21b, a third wire 21c, and a fourth wire 21d. The first wire 21a to the fourth wire 21d are arranged in the order of the fourth wire 21d, the second wire 21b, the first wire 21a, and the third wire 21c in the Y direction. The third wire 21c and the fourth wire 21d are located at both ends in the Y direction. The gate pad 17 is placed between the first wire 21a and the second wire 21b in the Y direction.

The first wire 21a, the second wire 21b, the third wire 21c, and the fourth wire 21d each electrically connect the first region 14a of the circuit pattern 14, the second chip 16, and the first chip 15. In the area where the first region 14a and the second chip 16 are connected, the first wire 21a, the second wire 21b, the third wire 21c, and the fourth wire 21d are arranged in parallel along the X direction. As a material for the first wire 21a, aluminum, for example, can be adopted. The same applies to the materials for the second wire 21b, the third wire 21c, and the fourth wire 21d.

The first wire 21a includes a first bonded portion 22a that is bonded to the first region 14a, a second bonded portion 23a that is bonded to the second chip 16, and a third bonded portion 24a that is bonded to the first chip 15. The first region 14a of the circuit pattern 14, the second chip 16, and the first chip 15 are continuously connected by the first wire 21a. The first wire 21a is stich-bonded to the first region 14a of the circuit pattern 14, the second chip 16, and the first chip 15. The first wire 21a is bent and bonded at the second bonded portion 23a. The first wire 21a is bent and bonded to cause the third bonded portion 24a to approach the third wire 21c.

The second wire 21b is arranged to be adjacent to the first wire 21a with the gate pad 17 sandwiched therebetween. The second wire 21b includes a fourth bonded portion 22b that is bonded to the first region 14a, a fifth bonded portion 23b that is bonded to the second chip 16, and a sixth bonded portion 24b that is bonded to the first chip 15. The first region 14a of the circuit pattern 14, the second chip 16, and the first chip 15 are continuously connected by the second wire 21b. The second wire 21b is stich-bonded to the first region 14a of the circuit pattern 14, the second chip 16, and the first chip 15. The second wire 21b is bent and bonded at the fifth bonded portion 23b. The second wire 21b is bent and bonded to cause the sixth bonded portion 24b to approach the fourth wire 21d.

The third wire 21c is arranged spaced apart from the first wire 21a in the Y direction. The third wire 21c includes a seventh bonded portion 22c that is bonded to the first region 14a, an eighth bonded portion 23c that is bonded to the second chip 16, and a ninth bonded portion 24c that is bonded to the first chip 15. The third wire 21c is stich-bonded to the first region 14a of the circuit pattern 14, the second chip 16, and the first chip 15, in the same manner as the first wire 21a. The third wire 21c is bent and bonded at the eighth bonded portion 23c. The third wire 21c is bent and bonded to cause the ninth bonded portion 24c to be away from the first wire 21a.

The fourth wire 21d is stich-bonded to the first region 14a of the circuit pattern 14, the second chip 16, and the first chip 15, in the same manner as the second wire 21b. The first region 14a of the circuit pattern 14, the second chip 16, and the first chip 15 are continuously connected by the four wires in total.

In the semiconductor device 11a, when a distance between the second bonded portion 23a and the third bonded portion 24a is represented as $D_1$, a distance between the eighth bonded portion 23c and the ninth bonded portion 24c as $D_2$, a length of the first wire 21a from the second bonded portion 23a to the third bonded portion 24a as $L_1$, and a length of the third wire 21c from the eighth bonded portion 23c to the ninth bonded portion 24c as $L_2$, a relationship of $|D_1-D_2|>|L_1-L_2|$ is fulfilled. This will be described in detail in Embodiment 3.

The semiconductor device 11a includes a gate wire 25. The gate wire 25 connects the gate pad 17 and the fourth region 14d. The gate wire 25 is arranged to extend along the X direction. The bonded portion of the gate wire 25 to the gate pad 17 is located between the first wire 21a and the second wire 21b in the Y direction.

As viewed in the thickness direction of the substrate 13, a first imaginary straight line 26a passing through the center of gravity of the first bonded portion 22a and the center of gravity of the second bonded portion 23a and a second imaginary straight line 26b passing through the center of gravity of the fourth bonded portion 22b and the center of gravity of the fifth bonded portion 23b are parallel. Here, the center of gravity of the first bonded portion 22a means, for example in the case where the first bonded portion 22a has widths in the X and Y directions, the middle portion of the widths in the X and Y directions. The same applies to the other bonded portions. A distance between the second imaginary straight line 26b and the third bonded portion 24a is greater than a distance between the second imaginary straight line 26b and the second bonded portion 23a. In other words, a third imaginary straight line 26c passing through the center of gravity of the second bonded portion 23a and the center of gravity of the third bonded portion 24a intersects with the first imaginary straight line 26a. The first imaginary straight line 26a, the second imaginary straight line 26b, and the third imaginary straight line 26c are shown in broken lines.

When a distance between the first imaginary straight line 26a and the second imaginary straight line 26b is represented as d, an angle of acute angle between the first imaginary straight line 26a and the third imaginary straight line 26c passing through the center of gravity of the second bonded portion 23a and the center of gravity of the third bonded portion 24a is represented as θ, and a width of the second bonded portion 23a in the direction in which the first wire 21a extends is represented as w, a relationship of $0<\theta<\sin^{-1} d/w$ is fulfilled. This will be described later.

According to the semiconductor device 11a, the first chip 15 is placed in parallel with the second chip 16. Stitch bonding is performed in the order of the first chip 15, the second chip 16, and the circuit pattern 14. Therefore, in the semiconductor device 11a, the occurrence of ringing caused by the surge voltage generated between the drain and source in the second chip 16 during turn-off, for example, can be reduced.

In the semiconductor device 11a, for reduction of the resistance of the first chip 15 during forward bias, the area of the first chip 15 is larger than that of the second chip 16 as viewed in the thickness direction of the substrate 13. When continuously bonding a wire from the first chip 15 with a large area to the second chip 16 with a small area, the wire is bent at the bonded portion to the second chip 16.

In the present embodiment, as viewed in the thickness direction of the substrate 13, the area of the first chip 15 is larger than that of the second chip 16. This can reduce the resistance in the first chip 15.

In the present embodiment, as viewed in the thickness direction of the substrate 13, the circuit pattern 14 includes the fourth region 14d that is located on the opposite side of the first region 14a as seen from the first chip 15. The semiconductor device 11a has the gate wire 25 that connects the gate pad 17 and the fourth region 14d. It is thus readily possible to arrange the gate wire 25.

In the present embodiment, the second chip 16 includes a SiC semiconductor. Adopting such a second chip 16 capable of achieving high breakdown voltage and low on-resistance results in a high-performance semiconductor device 11a.

In the present embodiment, the first chip 15 includes a SiC semiconductor. Adopting such a first chip 15 capable of achieving high breakdown voltage and low on-resistance results in a high-performance semiconductor device 11a.

An exemplary method of producing the semiconductor device 11a will now be described in brief. Firstly, a substrate 13 having a circuit pattern 14 and a heat dissipation plate 12 are prepared. The substrate 13 is placed on the heat dissipation plate 12, and a second chip 16 is placed on the third region 14c and a first chip 15 is placed on the second region 14b of the circuit pattern 14. Thereafter, the heat dissipation plate 12 is joined to the substrate 13, and the second chip 16 and the first chip 15 are also joined to the circuit pattern 14, by reflow soldering. Then, the circuit pattern 14, the second chip 16, and the first chip 15 are joined by wires by stich bonding. Here, for the stitch bonding of first wire 21a, second wire 21b, third wire 21c, and fourth wire 21d, the stitch bonding of the first wire 21a is performed lastly. For example, stitch bonding is performed in the order of the fourth wire 21d, the second wire 21b, the third wire 21c, and the first wire 21a. Further, wire bonding is also performed between terminals (not shown) and the circuit pattern 14, etc. Thereafter, the device is sealed with resin. The semiconductor device 11a is produced in this manner.

Figure 3:
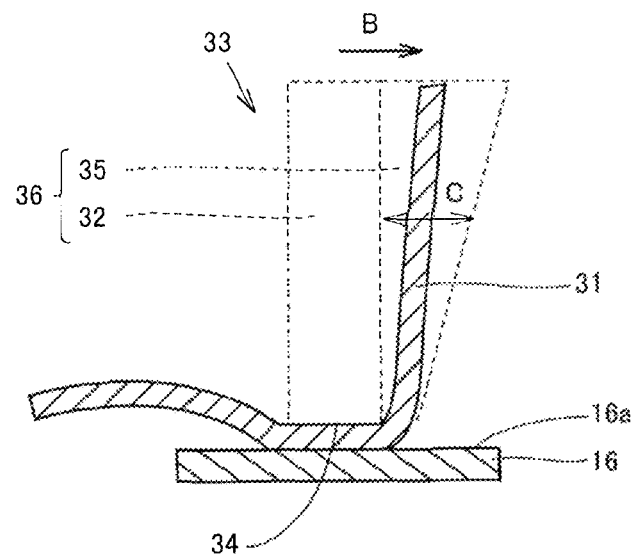
FIG. 3 is a schematic cross-sectional view when bonding a wire to a second chip.
Figure 4:
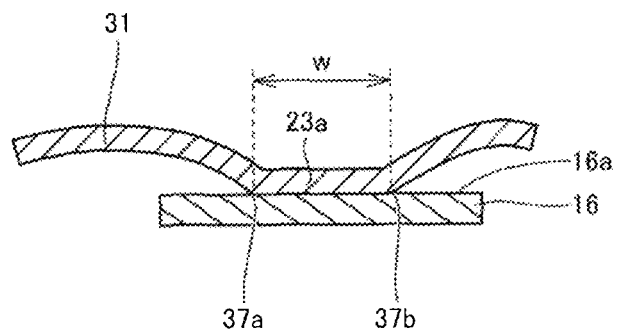
FIG. 4 is a schematic cross-sectional view showing the state where the wire is bonded to the second chip.

The process of stich-bonding wires in the method of producing the semiconductor device 11a will now be described. FIG. 3 is a schematic cross-sectional view showing the case of bonding a wire to the second chip 16. FIG. 4 is a schematic cross-sectional view showing the state where the wire is bonded to the second chip 16.

Referring to FIGS. 3 and 4, the stitch bonding of a wire 31 can be performed using, for example, a wire bonder 33 that has a wire bonder end section 36. In FIG. 3, the outline of the external shape of the wire bonder end section 36 is shown in broken lines. The wire bonder end section 36 includes a bond tool 32 having a contact portion 34 that contacts the wire 31, and a wire feeding portion 35 that feeds the wire 31.

The wire bonder end section 36 moves in the direction indicated by the arrow B while feeding the wire 31 from the wire feeding portion 35 as needed. During the movement, with the wire 31 being fed from the wire feeding portion 35, the contact portion 34 of the bond tool 32 is brought into contact with the wire 31 to vibrate the wire 31 ultrasonically, to thereby bond the wire 31 to the surface 16a of the second chip 16. Here, in the wire bonder 33, a space for the wire feeding portion 35 should be secured in the direction of movement. Specifically, in addition to a bonded width w to be bonded by the contact portion 34 of the bond tool 32, a width C equivalent to the bonded width w is required. The bonded width w is shown in FIG. 4 as a distance between both ends 37a, 37b of the second bonded portion 23a in the direction in which the wire 31 extends.

Figure 5:
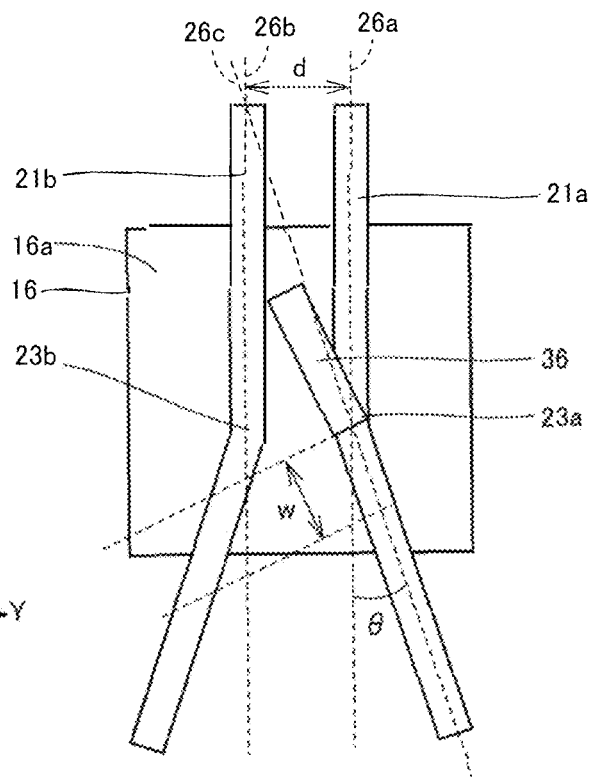
FIG. 5 is a schematic plan view showing the state of bonding a first wire to the second chip by bending the first wire at a second bonded portion.

FIG. 5 is a schematic plan view showing the state of bonding the first wire 21a to the second chip 16 by bending the first wire 21a at the second bonded portion 23a. In FIG. 5, the thicknesses of the first wire 21a and the second wire 21b are exaggerated and shown thicker from the standpoint of ease of understanding.

Referring to FIG. 5, as previously explained, the relationship of $0<\theta<\sin^{-1} d/w$ is fulfilled in the semiconductor device 11a. Therefore, when bonding the first wire 21a to the second chip 16 by bending the wire at the second bonded portion 23a, the risk of contact between the wire bonder end section 36 and the already installed second wire 21b can be reduced. In other words, the semiconductor device 11a is configured such that the angle θ of the acute angle between the first imaginary straight line 26a and the third imaginary straight line 26c is made as small as possible to thereby suppress contact between the wire bonder 33 and the second wire 21b at the time of stitch bonding. Therefore, according to the semiconductor device 11a, bending of the second wire 21b can be suppressed.

Embodiment 2

Figure 6:
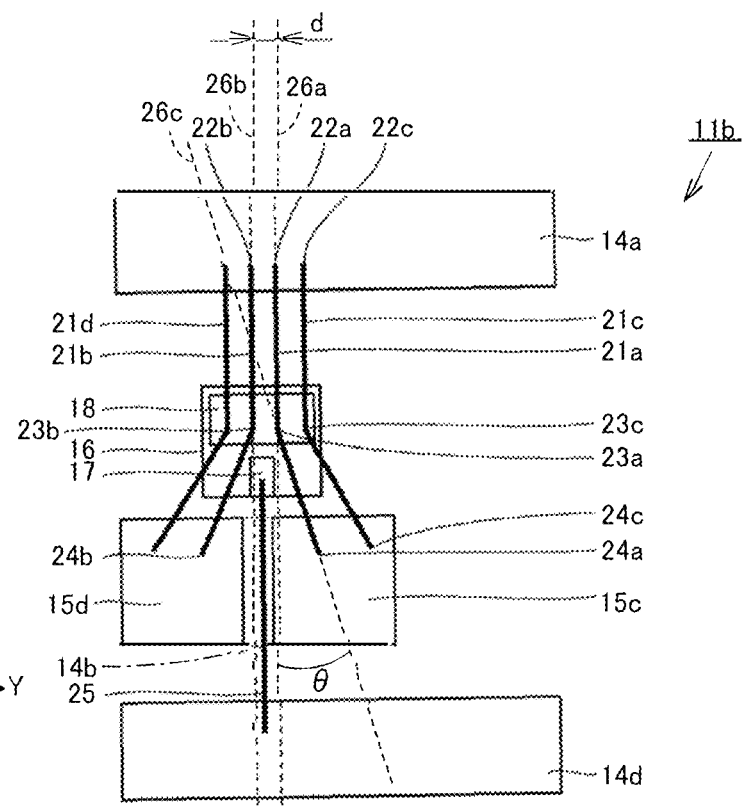
FIG. 6 is a schematic plan view of a semiconductor device of Embodiment 2 as viewed in the thickness direction of the substrate.

Another embodiment, Embodiment 2, will now be described. FIG. 6 is a schematic plan view of a semiconductor device of Embodiment 2 as viewed in the thickness direction of the substrate. Embodiment 2 differs from Embodiment 1 in that a plurality of chips containing diodes are disposed.

Referring to FIGS. 1, 2, and 6, the semiconductor device 11b of Embodiment 2 differs from the semiconductor device 11a of Embodiment 1 in that two chips, a third chip 15c and a fourth chip 15d, aligned in the Y direction are disposed in place of the first chip 15 of the semiconductor device 11a of Embodiment 1.

The semiconductor device 11b in Embodiment 2 includes a substrate 13, a circuit pattern 14, a second chip 16, the third chip 15c, and the fourth chip 15d. The circuit pattern 14 includes a first region 14a, a second region 14b, a third region 14c, and a fourth region 14d. The second region 14b is located away from the first region 14a. The third region 14c is located between the first region 14a and the second region 14b. The third chip 15c includes a first diode. The third chip 15c is placed in the second region 14b. The fourth chip 15d includes a second diode. The fourth chip 15d is placed in the second region 14b, at a position different from the third chip 15c. Specifically, the third chip 15c and the fourth chip 15d are arranged spaced apart from each other in the Y direction. The fourth region 14d is located on the opposite side of the first region 14a as seen from the third chip 15c and the fourth chip 15d. In the present embodiment, a distance between the third chip 15c and the fourth region 14d in the X direction is equal to a distance between the fourth chip 15d and the fourth region 14d in the X direction.

The semiconductor device 11b includes a first wire 21a and a second wire 21b. The first wire 21a includes a first bonded portion 22a that is bonded to the first region 14a, a second bonded portion 23a that is bonded to the second chip 16, and a third bonded portion 24a that is bonded to the third chip 15c. The second wire 21b is arranged to be adjacent to the first wire 21a with a gate pad 17 sandwiched therebetween. The second wire 21b includes a fourth bonded portion 22b that is bonded to the first region 14a, a fifth bonded portion 23b that is bonded to the second chip 16, and a sixth bonded portion 24b that is bonded to the fourth chip 15d.

As viewed in the thickness direction of the substrate 13, a first imaginary straight line 26a passing through the center of gravity of the first bonded portion 22a and the center of gravity of the second bonded portion 23a and a second imaginary straight line 26b passing through the center of gravity of the fourth bonded portion 22b and the center of gravity of the fifth bonded portion 23b are parallel. A distance between the second imaginary straight line 26b and the center of gravity of the third bonded portion 24a is greater than a distance between the second imaginary straight line 26b and the center of gravity of the second bonded portion 23a. When a distance between the first imaginary straight line 26a and the second imaginary straight line 26b is represented as d, an angle of acute angle between the first imaginary straight line 26a and a third imaginary straight line 26c passing through the center of gravity of the second bonded portion 23a and the center of gravity of the third bonded portion 24a is represented as θ, and a width of the second bonded portion 23a in the direction in which the first wire 21a extends is represented as w, a relationship of $0 < \theta \leq \sin^{-1} d/w$ is fulfilled.

According to the semiconductor device 11b as described above, bending of the second wire 21b can be suppressed as in the semiconductor device 11a in Embodiment 1.

In the present embodiment, as viewed in the thickness direction of the substrate 13, a total area of the third chip 15c and the fourth chip 15d is larger than the area of the second chip 16. This can reduce the electric current flowing toward the second chip 16.

While the semiconductor device 11b in the present embodiment includes two chips containing diodes, the number of chips is not limited thereto; the semiconductor device 11b may include three or more chips containing diodes.

Embodiment 3

Figure 7:
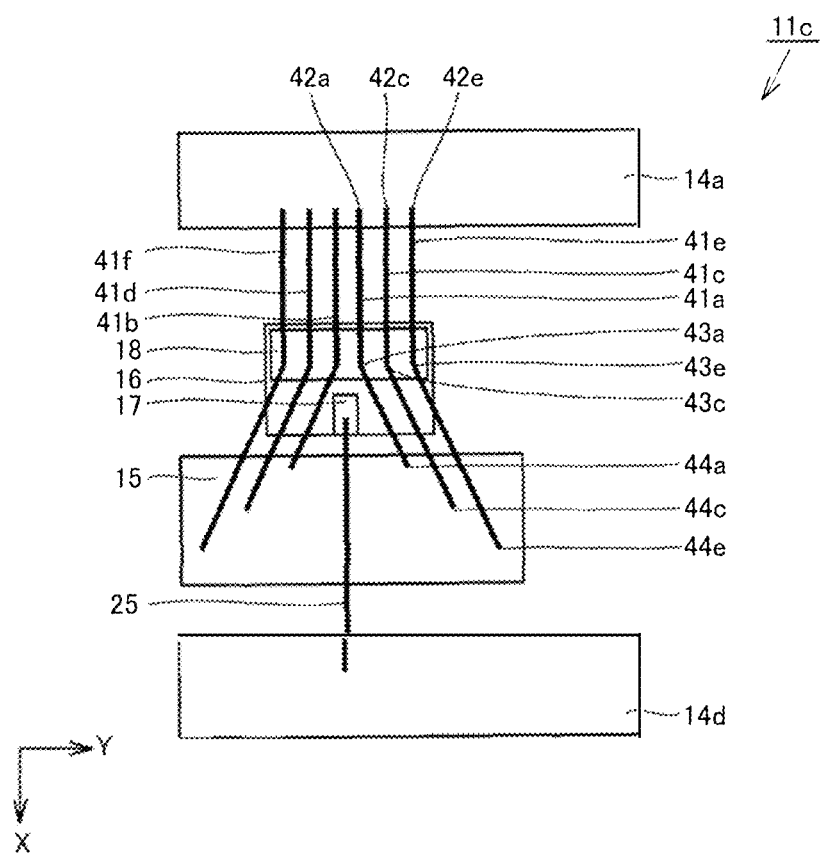
FIG. 7 is a schematic plan view of a semiconductor device of Embodiment 3 as viewed in the thickness direction of the substrate.

Still another embodiment, Embodiment 3, will now be described. FIG. 7 is a schematic plan view of a semiconductor device of Embodiment 3 as viewed in the thickness direction of the substrate. Embodiment 3 differs from Embodiment 1 in the shape and number of wires.

Referring to FIG. 7, the semiconductor device 11c in Embodiment 3 includes a first wire 41a, a second wire 41b, a third wire 41c, a fourth wire 41d, a fifth wire 41e, and a sixth wire 41f. The first wire 41a to the sixth wire 41f are arranged in the order of the sixth wire 41f, the fourth wire 41d, the second wire 41b, the first wire 41a, the third wire 41c, and the fifth wire 41e in the Y direction. The first wire 41a to the sixth wire 41f each electrically connect the first region 14a, the second chip 16, and the first chip 15. The configurations of the first wire 41a, the third wire 41c, and the fifth wire 41e will be described below. It should be noted that the configurations of the second wire 41b, the fourth wire 41d, and the sixth wire 41f are similar, except that the directions of bending are different from those of the first wire 41a, the third wire 41c, and the fifth wire 41e, respectively. Therefore, the description thereof will not be repeated.

The first wire 41a includes a first bonded portion 42a that is bonded to the first region 14a, a second bonded portion 43a that is bonded to the second chip 16, and a third bonded portion 44a that is bonded to the first chip 15. The first wire 41a is bent at the second bonded portion 43a. The third wire 41c includes a seventh bonded portion 42c that is bonded to the first region 14a, an eighth bonded portion 43c that is bonded to the second chip 16, and a ninth bonded portion 44c that is bonded to the first chip 15. The third wire 41c is bent at the eighth bonded portion 43c. The fifth wire 41e includes a tenth bonded portion 42e that is bonded to the first region 14a, an eleventh bonded portion 43e that is bonded to the second chip 16, and a twelfth bonded portion 44e that is bonded to the first chip 15. The fifth wire 41e is bent at the eleventh bonded portion 43e.

Figure 8:
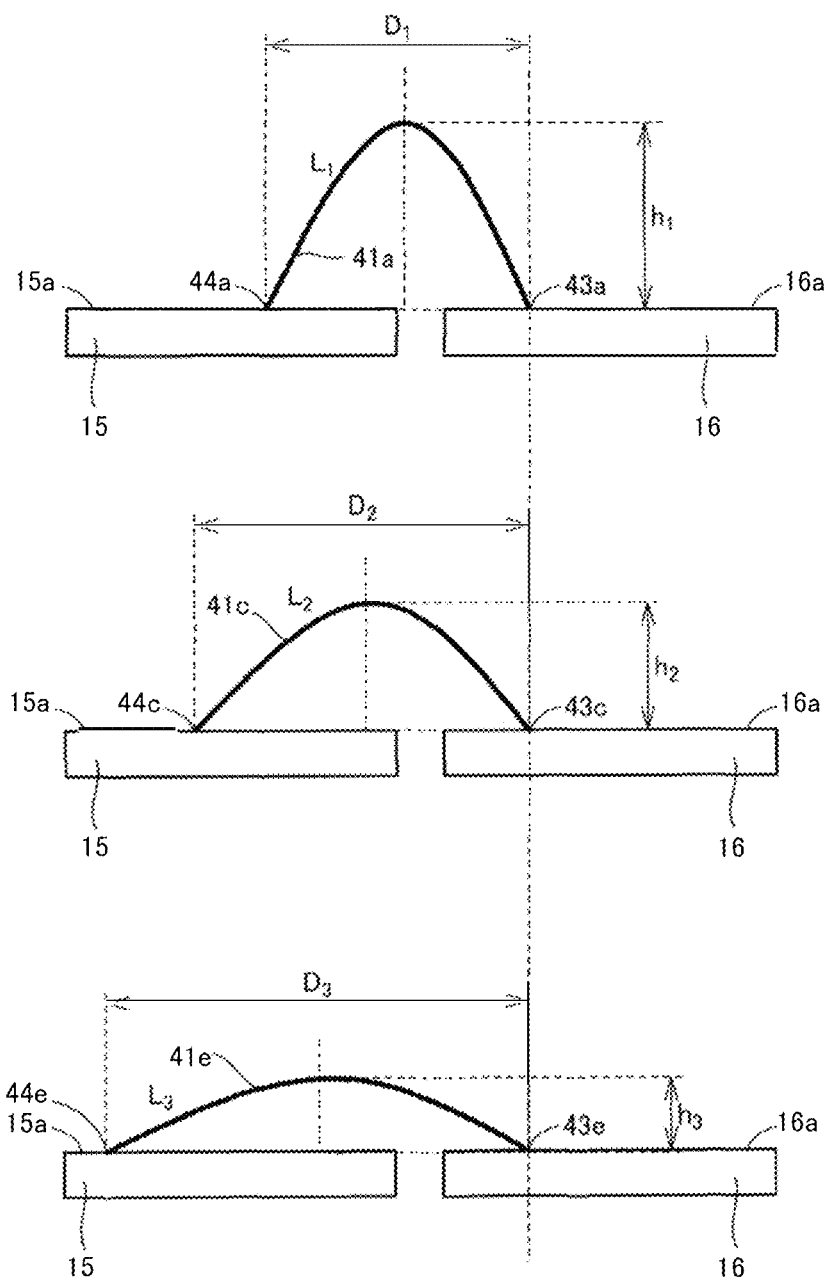
FIG. 8 is a schematic side view showing a first wire, a third wire, and a fifth wire in Embodiment 3.

FIG. 8 is a schematic side view showing the first wire 41a, the third wire 41c, and the fifth wire 41e in Embodiment 3. The first wire 41a, the third wire 41c, and the fifth wire 41e are shown in alignment in FIG. 8 from the standpoint of ease of understanding. In FIG. 8 and the following FIGS. 9, 11, and 12, the portions of the wires connecting between the second chip 16 and the first region 14a of the circuit pattern 14 are omitted from the illustration.

Referring to FIGS. 7 and 8, in the semiconductor device 11c in Embodiment 3, when a distance between the second bonded portion 43a and the third bonded portion 44a is represented as $D_1$, a distance between the eighth bonded portion 43c and the ninth bonded portion 44c as $D_2$, a length of the first wire 41a from the second bonded portion 43a to the third bonded portion 44a as $L_1$, and a length of the third wire 41c from the eighth bonded portion 43c to the ninth bonded portion 44c as $L_2$, a relationship of $|D_1 - D_2| > |L_1 - L_2|$ is fulfilled.

With this configuration, the difference in length between the first wire 41a and the third wire 41c in the portions connecting the second chip 16 and the first chip 15 can be made smaller, whereby the difference in resistance of the wires can be reduced. It is thus possible to avoid the concentration of electric current in the first chip 15, and substantially suppress the increase in resistance of the first chip 15. It is also possible to avoid the concentration of electric current in a specific wire, and suppress the reduction of wire life due to heat generation in the wire.

It should be noted that in Embodiment 1 described above, in the semiconductor device 11a, the relationship of $|D_1 - D_2| > |L_1 - L_2|$ is fulfilled, where $D_1$ represents the distance between the second bonded portion 23a and the third bonded portion 24a, $D_2$ represents the distance between the eighth bonded portion 23c and the ninth bonded portion 24c, $L_1$ represents the length of the first wire 21a from the second bonded portion 23a to the third bonded portion 24a, and $L_2$ represents the length of the third wire 21c from the eighth bonded portion 23c to the ninth bonded portion 24c. With this configuration, as in the case of Embodiment 3, the difference in length between the first wire 21a and the third wire 21c in the portions connecting the second chip 16 and the first chip 15 can be made smaller, whereby the difference in resistance of the wires can be reduced. It is thus possible to avoid the concentration of electric current in the first chip 15, and substantially suppress the increase in resistance of the first chip 15. It is also possible to avoid the concentration of electric current in a specific wire, and suppress the reduction of wire life due to heat generation in the wire. It should be noted that while the relationship between the first wire 21a and the third wire 21c was defined in Embodiment 1, it may be configured such that the above-described relationship of $|D_1-D_2|>|L_1-L_2|$ holds for a relationship between the first wire 21a and the second wire 21b, for example.

Further, in the semiconductor device 11c in Embodiment 3, when a distance between the eleventh bonded portion 43e and the twelfth bonded portion 44e is represented as $D_3$ and a length of the fifth wire 41e from the eleventh bonded portion 43e to the twelfth bonded portion 44e as $L_3$, a relationship of $|D_2-D_3|>|L_2-L_3|$ is fulfilled. A relationship of $|D_1-D_3|>|L_1-L_3|$ is also fulfilled. With this configuration, it is possible to suppress the increase in resistance of the first chip 15, and suppress the reduction of wire life due to heat generation in the wires.

Figure 9:
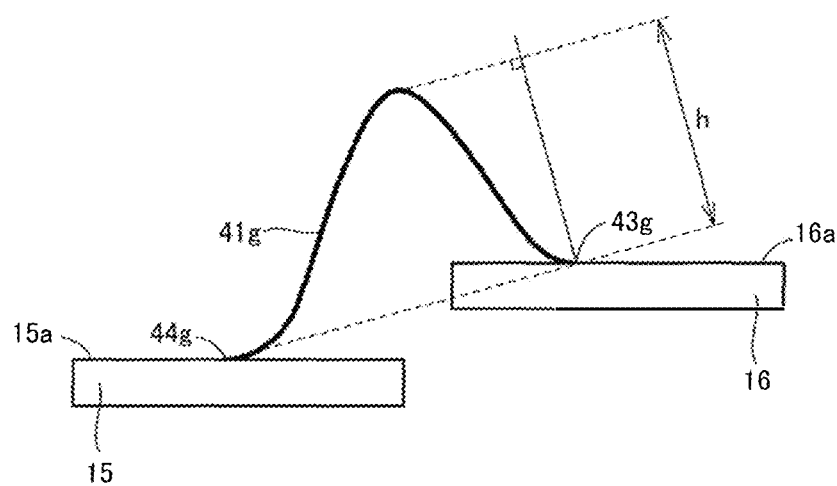
FIG. 9 is a schematic side view of a semiconductor device for defining the height of a wire loop.

Specifically, for example, a structure in which the heights of wire loops of the first wire 41a, the third wire 41c, and the fifth wire 41e are different can be adopted. Here, the definition of the height of a wire loop will be described. FIG. 9 is a schematic side view of a semiconductor device for defining the height of a wire loop.

Referring to FIG. 9, a wire 41g is bonded to the second chip 16 at a second bonded portion 43g and to the first chip 15 at a third bonded portion 44g. A maximum value of the length of a line segment that connects the wire 41g and a straight line passing through the second bonded portion 43g and the third bonded portion 44g and is perpendicular to the straight line is regarded as the height h of the loop of the wire 41g.

Referring again to FIG. 8, in the first wire 41a, a maximum value of the length of a line segment that connects the first wire 41a and a straight line passing through the second bonded portion 43a and the third bonded portion 44a and is perpendicular to the straight line is regarded as the height $h_1$ of the first wire 41a. In the third wire 41c, a maximum value of the length of a line segment that connects the third wire 41c and a straight line passing through the eighth bonded portion 43c and the ninth bonded portion 44c and is perpendicular to the straight line is regarded as the height $h_2$ of the third wire 41c. Then, it is set such that $h_1 \geq h_2$ in the case where $D_1 \leq D_2$, which facilitates establishing the relationship of $|D_1-D_2|>|L_1-L_2|$.

Further, in the fifth wire 41e, a maximum value of the length of a line segment that connects the fifth wire 41e and a straight line passing through the eleventh bonded portion 43e and the twelfth bonded portion 44e and is perpendicular to the straight line is regarded as the height $h_3$ of the fifth wire 41e. Then, it is set such that $h_2 \geq h_3$ in the case where $D_2 \leq D_3$, which facilitates establishing the relationship of $|D_2-D_3|>|L_2-L_3|$. Further, it is set such that $h_1 \geq h_3$ in the case where $D_1 \leq D_3$, which facilitates establishing the relationship of $|D_1-D_3|>|L_1-L_3|$.

It should be noted that in the relationship among the first wire 41a, the third wire 41c, and the fifth wire 41e, it is set such that $h_1 \geq h_2 \geq h_3$ in the case where $D_1 \leq D_2 \leq D_3$. With this configuration, it is readily possible to establish the relationship of $|D_1-D_2|>|L_1-L_2|$, the relationship of $|D_1-D_3|>|L_1-L_3|$, and the relationship of $|D_1-D_3|>|L_2-L_3|$ for each wire.

It should be noted that a typical wire used has a minimum diameter of 10 μm. Further, in the semiconductor device 11c, a sealing agent for sealing the device with resin has a height of generally 3 cm. Therefore, the heights $h_1$, $h_2$, and $h_3$ are each made preferably longer than 10 μm in order to avoid wire exposure. They are each made preferably shorter than 3 cm. More preferably, the heights $h_1$, $h_2$, and $h_3$ should each be greater than 100 μm in order to avoid clogging of a filler when the sealing agent contains the filler. They should also be smaller than 2 cm for inductance and other practical conditions.

Further, the difference between the heights $h_1$, $h_2$, and $h_3$ is preferably greater than 10 μm, which is the minimum diameter of the wire. More preferably, the difference between the heights $h_1$, $h_2$, and $h_3$ should be greater than 100 μm to avoid clogging of the filler for the same reason as above.

Embodiment 4

Figure 10:
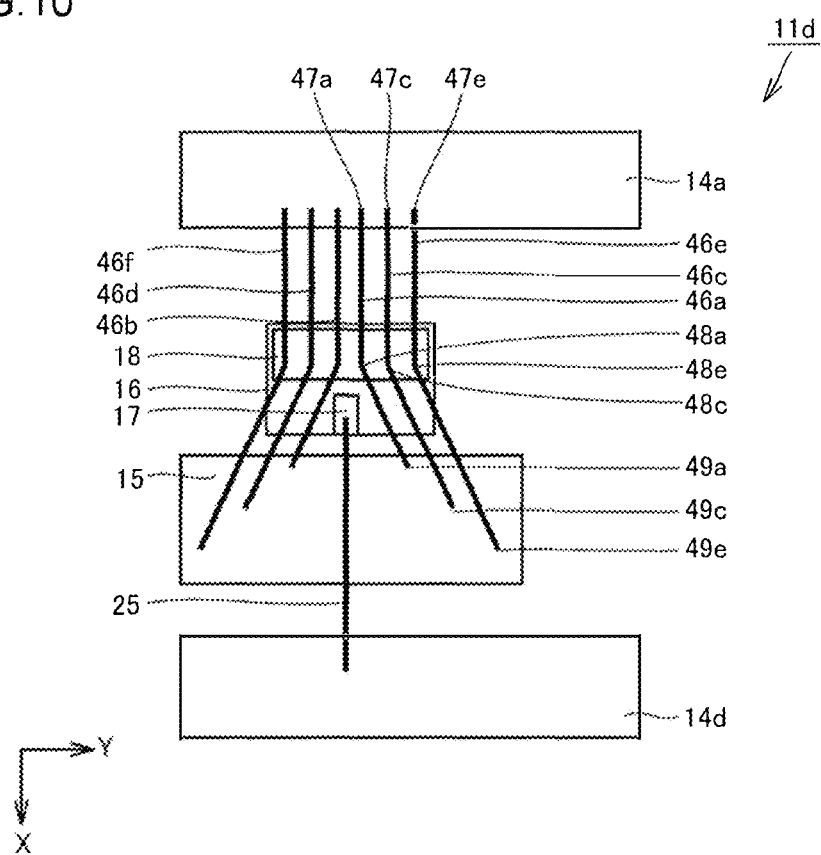
FIG. 10 is a schematic plan view of a semiconductor device of Embodiment 4 as viewed in the thickness direction of the substrate.

Yet another embodiment, Embodiment 4, will now be described. FIG. 10 is a schematic plan view of a semiconductor device of Embodiment 4 as viewed in the thickness direction of the substrate. Embodiment 4 differs from Embodiment 3 in the shape of wires.

Referring to FIG. 10, the semiconductor device 11d in Embodiment 4 includes a first wire 46a, a second wire 46b, a third wire 46c, a fourth wire 46d, a fifth wire 46e, and a sixth wire 46f. The first wire 46a to the sixth wire 46f are arranged in the order of the sixth wire 46f, the fourth wire 46d, the second wire 46b, the first wire 46a, the third wire 46c, and the fifth wire 46e in the Y direction. The first wire 46a to the sixth wire 46f each electrically connect the first region 14a, the second chip 16, and the first chip 15. The configurations of the first wire 46a, the third wire 46c, and the fifth wire 46e will be described below. It should be noted that the configurations of the second wire 46b, the fourth wire 46d, and the sixth wire 46f are similar, except that the directions of bending are different from those of the first wire 46a, the third wire 46c, and the fifth wire 46e, respectively. Therefore, the description thereof will not be repeated.

The first wire 46a includes a first bonded portion 47a that is bonded to the first region 14a, a second bonded portion 48a that is bonded to the second chip 16, and a third bonded portion 49a that is bonded to the first chip 15. The first wire 46a is bent at the second bonded portion 48a. The third wire 46c includes a seventh bonded portion 47c that is bonded to the first region 14a, an eighth bonded portion 48c that is bonded to the second chip 16, and a ninth bonded portion 49c that is bonded to the first chip 15. The third wire 46c is bent at the eighth bonded portion 48c. The fifth wire 46e includes a tenth bonded portion 47e that is bonded to the first region 14a, an eleventh bonded portion 48e that is bonded to the second chip 16, and a twelfth bonded portion 49e that is bonded to the first chip 15. The fifth wire 46e is bent at the eleventh bonded portion 48e.

Figure 11:
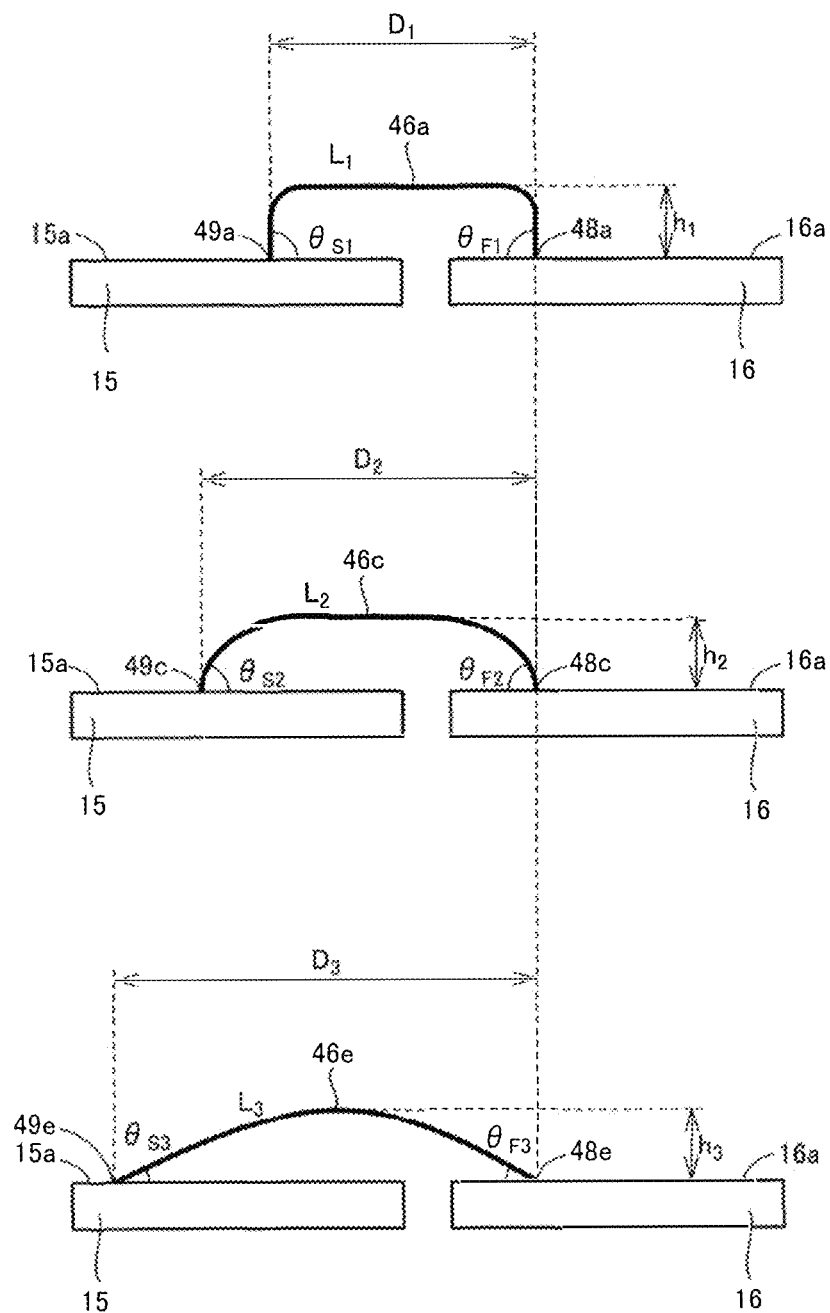
FIG. 11 is a schematic side view showing a first wire, a third wire, and a fifth wire in Embodiment 4.

FIG. 11 is a schematic side view showing the first wire 46a, the third wire 46c, and the fifth wire 46e in Embodiment 4. In FIG. 11, the first wire 46a, the third wire 46c, and the fifth wire 46e are shown in alignment from the standpoint of ease of understanding.

Referring to FIGS. 10 and 11, in the semiconductor device 11d in Embodiment 4, when a distance between the second bonded portion 48a and the third bonded portion 49a is represented as $D_1$, a distance between the eighth bonded portion 48c and the ninth bonded portion 49c as $D_2$, a length of the first wire 46a from the second bonded portion 48a to the third bonded portion 49a as $L_1$, and a length of the third wire 46c from the eighth bonded portion 48c to the ninth bonded portion 49c as $L_2$, a relationship $|D_1-D_2|>|L_1-L_2|$ is fulfilled.

With this configuration, the difference in length between the first wire 46a and the third wire 46c in the portions connecting the second chip 16 and the first chip 15 can be made smaller, whereby the difference in resistance of the wires can be reduced. It is thus possible to avoid the concentration of electric current in the first chip 15, and substantially suppress the increase in resistance of the first chip 15. It is also possible to avoid the concentration of electric current in a specific wire, and suppress the reduction of wire life due to heat generation in the wire.

Figure 12:
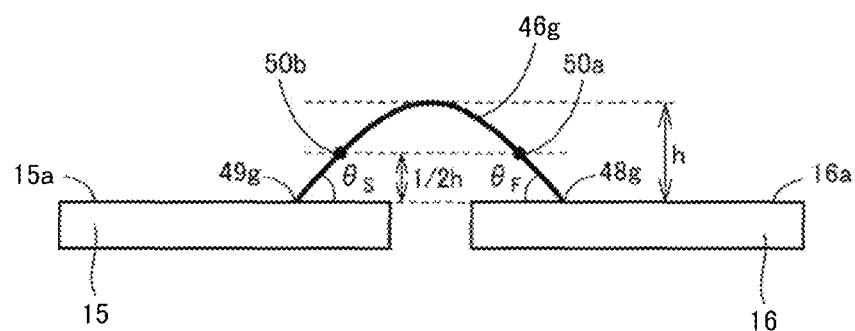
FIG. 12 is a schematic side view of a semiconductor device for defining the rise angle of a wire loop.

Specifically, for example, a structure in which the rise angles of wire loops at the bonded portions of the first wire 41a, the third wire 41c, and the fifth wire 41e are different can be adopted. Here, the definition of the rise angle of a wire loop at the bonded portion will be described. FIG. 12 is a schematic side view of a semiconductor device for defining the rise angle of a wire loop at the bonded portion.

Referring to FIG. 12, a wire 46g is bonded to the second chip 16 at a second bonded portion 43g and to the first chip 15 at a third bonded portion 44g. A length h of a line that is perpendicular to a straight line passing through the second bonded portion 43g and the third bonded portion 44g and intersects with the wire 41g is regarded as the height of the loop of the wire 41g. The loop height h is derived in the same manner as in the case of Embodiment 3 described above. An angle of acute angle between a straight line passing through the second bonded portion 48g and an intersection 50a with the wire 46g near the second bonded portion 48g at a position of ½h, which is half the height of the wire loop, and the straight line passing through the second bonded portion 48g and the third bonded portion 49g is represented as $\theta_F$. An angle of acute angle between a straight line passing through the third bonded portion 49g and an intersection 50b with the wire 46g near the third bonded portion 49g at a position of ½h and the straight line passing through the second bonded portion 48g and the third bonded portion 49g is represented as $\theta_S$. It is set such that $\theta_F+\theta_S=\theta$. It is set such that $\theta_{F1}+\theta_{S1}=\theta_1$. It is set such that $\theta_{F2}+\theta_{S2}=\theta_2$. Then, it is set such that $\theta_1 \geq \theta_2$ in the case where $D_1 \leq D_2$. This facilitates establishing the relationship of $|D_1-D_2|>|L_1-L_2|$.

Further, in the fifth wire 46e, an angle $\theta_3$ is derived in the same manner from $\theta_{F3}+\theta_{S3}=\theta_3$. Then, it is set such that $\theta_2 \geq \theta_3$ in the case where $D_2 \leq D_3$. This facilitates establishing the relationship of $|D_2-D_3|>|L_2-L_3|$. Further, it is set such that $\theta_1 \geq \theta_3$ in the case where $D_1 \leq D_3$. This facilitates establishing the relationship of $|D_1-D_3|>|L_1-L_3|$.

It should be noted that in the relationship among the first wire 46a, the third wire 46c, and the fifth wire 46e, it is set such that $\theta_1 > \theta_2 > \theta_3$ in the case where $D_1 \leq D_2 \leq D_3$. This facilitates establishing the relationships of $|D_1-D_2|>|L_1-L_2|$, the relationship of $|D_1-D_3|>|L_1-L_3|$, and the relationship of $|D_2-D_3|>|L_2-L_3|$ for each wire.

It should be noted that the adjustment of the rise angle of a wire loop at the bonded portion in Embodiment 4 above and the adjustment of the height of a wire loop in Embodiment 3 above can be performed through, for example, the adjustment of the moving speed of the wire bonder end section when performing stitch bonding, the adjustment of the wire feeding speed in the wire feeding portion, and others.

Another Embodiment

In the above embodiments, it has been configured such that as viewed in the thickness direction of the substrate, the circuit pattern includes the fourth region located on the opposite side of the first region as seen from the first chip and that the semiconductor device includes the gate wire connecting the gate pad and the fourth region. However, the circuit pattern is not limited thereto; it may be configured to have no fourth region.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

DESCRIPTION OF REFERENCE NUMERALS 11a, 11b, 11c, 11d: semiconductor device
12: heat dissipation plate
12a, 12b, 13a, 13b: main surface
13: substrate
14: circuit pattern
14a: first region
14b: second region
14c: third region
14d: fourth region
15: first chip
15a, 15b, 16a, 16b: surface
15c: third chip
15d: fourth chip
16: second chip
17: gate pad
18: source pad
21a, 41a, 46a: first wire
21b, 41b, 46b: second wire
21c, 41c, 46c: third wire
21d, 41d, 46d: fourth wire
22a, 42a, 47a: first bonded portion
22b: fourth bonded portion
23a, 43a, 43g, 48a: second bonded portion
23b: fifth bonded portion
24a, 44a, 44g, 49a: third bonded portion
24b: sixth bonded portion
25: gate wire
26a: first imaginary straight line
26b: second imaginary straight line
26c: third imaginary straight line
31: wire
32: wire tool
33: wire bonder
34: contact portion
35: wire feeding portion
36: wire bonder end section
37a, 37b: end
41e, 46e: fifth wire
41f, 46f: sixth wire
42c, 47c: seventh bonded portion
42e, 47e: tenth bonded portion
43c, 48c: eighth bonded portion 43e, 48e: eleventh bonded portion
44c, 49c: ninth bonded portion
44e, 49e: twelfth bonded portion
50a, 50b: intersection

The invention claimed is:
1. A semiconductor device comprising:
a substrate;
a circuit pattern disposed on the substrate, the circuit pattern including a first region, a second region located away from the first region, and a third region located between the first region and the second region;
a first chip disposed in the second region, the first chip including a diode;
a second chip disposed in the third region, the second chip including a vertical transistor having a source pad disposed on a surface opposite to a surface facing the third region in a thickness direction of the substrate, and a gate pad disposed at a position different from the source pad;
a first wire including a first bonded portion bonded to the first region, a second bonded portion bonded to the second chip, and a third bonded portion bonded to the first chip; and
a second wire arranged to be adjacent to the first wire with the gate pad sandwiched therebetween, the second wire including a fourth bonded portion bonded to the first region, a fifth bonded portion bonded to the second chip, and a sixth bonded portion bonded to the first chip,
wherein:
a first portion of the first wire connects the first bonded portion of the second bonded portion,
a first portion of the second wire, parallel to the first portion of the first wire by a distance d, connects the fourth bonded portion to the fifth bonded portion, and
a second portion of the first wire connects the second bonded portion to the third bonded portion, the first and second portions of the first wire forming an obtuse angle 180−θ, where 0<θ<90 and 0<180−θ<$\sin^{-1}$ d/w, where w represents a width of the second bonded portion in a direction in which the first wire extends.

2. The semiconductor device according to claim 1, further comprising a third wire including a seventh bonded portion bonded to the first region, an eighth bonded portion bonded to the second chip, and a ninth bonded portion bonded to the first chip, wherein
a relationship of $|D_1-D_2|>|L_1-L_2|$ is fulfilled, where $D_1$ represents a distance between the second bonded portion and the third bonded portion, $D_2$ represents a distance between the eighth bonded portion and the ninth bonded portion, $L_1$ represents a length of the first wire from the second bonded portion to the third bonded portion, and $L_2$ represents a length of the third wire from the eighth bonded portion to the ninth bonded portion.

3. The semiconductor device according to claim 1, wherein as viewed in the thickness direction of the substrate, the circuit pattern further includes a fourth region located on an opposite side of the first region as seen from the first chip, the semiconductor device further comprising a gate wire connecting the gate pad and the fourth region.

4. The semiconductor device according to claim 1, wherein as viewed in the thickness direction of the substrate, the first chip has an area greater than an area of the second chip.

5. The semiconductor device according to claim 1, wherein the second chip includes a SiC semiconductor layer.

6. The semiconductor device according to claim 1, wherein the first chip includes a SiC semiconductor layer.

7. A semiconductor device comprising:
a substrate;
a circuit pattern disposed on the substrate, the circuit pattern including a first region, a second region located away from the first region, and a third region located between the first region and the second region;
a first chip disposed in the second region, the first chip including a first diode;
a second chip disposed in the second region at a position different from the first chip, the second chip including a second diode;
a third chip disposed in the third region, the third chip including a vertical transistor having a source pad disposed on a surface opposite to a surface facing the third region in a thickness direction of the substrate, and a gate pad disposed at a position different from the source pad;
a first wire including a first bonded portion bonded to the first region, a second bonded portion bonded to the third chip, and a third bonded portion bonded to the first chip; and
a second wire arranged to be adjacent to the first wire with the gate pad sandwiched therebetween, the second wire including a fourth bonded portion bonded to the first region, a fifth bonded portion bonded to the third chip, and a sixth bonded portion bonded to the second chip,
wherein:
a first portion of the first wire connects the first bonded portion to the second bonded portion,
a first portion of the second wire, parallel to the first portion of the first wire by a distance d, connects the fourth bonded portion to the fifth bonded portion, and
a second portion of the first wire connects the second bonded portion to the third bonded portion, the first and second portions of the first wire forming an obtuse angle 180−θ, where 0<θ<90 and 0<180−θ<$\sin^{-1}$ d/w, where w represents a width of the second bonded portion in a direction in which the first wire extends.

8. The semiconductor device according to claim 7, wherein as viewed in the thickness direction of the substrate, a total area of the first chip and the second chip is greater than an area of the third chip.

9. The semiconductor device according to claim 1, a second portion of the second wire connects the fifth bonded portion to the sixth bonded portion, the first and second portions of the second wire forming an obtuse angle 180+θ, where 0<θ<90 and 0<180+θ<$\sin^{-1}$ d/w, where w represents a width of the second bonded portion in a direction in which the second wire extends.

10. The semiconductor device according to claim 7, wherein a second portion of the second wire connects the fifth bonded portion to the sixth bonded portion, the first and second portions of the second wire forming an obtuse angle 180+θ, where 0<θ<90 and 0<180+θ<$\sin^{-1}$ d/w, where w represents a width of the second bonded portion in a direction in which the second wire extends.

* * * * *